(12) United States Patent
Kohn

(10) Patent No.: US 10,845,562 B2
(45) Date of Patent: Nov. 24, 2020

(54) REEL FOR THE PURPOSE OF WINDING A LENGTH OF CABLE OF OPTICAL FIBER CABLE TYPE

(71) Applicant: SAGEMCOM BROADBAND SAS, Rueil-Malmaison (FR)

(72) Inventor: Stéphane Kohn, Rueil Malmaison (FR)

(73) Assignee: Sagemcom Broadband SAS, Rueil Malmaison (FR)

( * ) Notice: Subject to any disclaimer, the term of this patent is extended or adjusted under 35 U.S.C. 154(b) by 0 days.

(21) Appl. No.: 16/343,316

(22) PCT Filed: Oct. 19, 2017

(86) PCT No.: PCT/EP2017/076782
§ 371 (c)(1),
(2) Date: Apr. 18, 2019

(87) PCT Pub. No.: WO2018/073380
PCT Pub. Date: Apr. 26, 2018

(65) Prior Publication Data
US 2020/0064578 A1 Feb. 27, 2020

(30) Foreign Application Priority Data
Oct. 21, 2016 (FR) .................................. 16 60259

(51) Int. Cl.
*G02B 6/00* (2006.01)
*G02B 6/44* (2006.01)
*G02B 6/38* (2006.01)
*G02B 6/42* (2006.01)
*H05K 1/02* (2006.01)

(52) U.S. Cl.
CPC .......... *G02B 6/4457* (2013.01); *G02B 6/3897* (2013.01); *G02B 6/4245* (2013.01); *B65H 2701/32* (2013.01); *H05K 1/02* (2013.01); *H05K 2201/10121* (2013.01); *H05K 2203/044* (2013.01); *H05K 2203/304* (2013.01)

(58) Field of Classification Search
CPC .. G02B 6/3897; G02B 6/4452; G02B 6/4457; G02B 6/00
See application file for complete search history.

(56) References Cited

U.S. PATENT DOCUMENTS

| 7,151,912 B1 * | 12/2006 | Morrison | H04M 1/15 455/90.3 |
| 8,167,633 B1 * | 5/2012 | Wu | H01R 35/025 439/164 |
| 2004/0124233 A1 | 7/2004 | Ensslin et al. | |
| 2010/0282891 A1 | 11/2010 | Criscione et al. | |
| 2016/0124164 A1 | 5/2016 | Doerr | |

FOREIGN PATENT DOCUMENTS

FR  2 814 246 A1  3/2002

* cited by examiner

*Primary Examiner* — Jennifer Doan
(74) *Attorney, Agent, or Firm* — Muncy, Geissler, Olds & Lowe, P.C.

(57) ABSTRACT

A reel for the purpose of winding a length of cable of optical fiber cable type includes a winding support for winding the length of cable, a retaining part suitable for retaining the length of cable wound around the winding support, a first attachment part for the purpose of attaching the reel to an edge of a circuit board such that the reel is positioned laterally with respect to the circuit board, and a second attachment part for the purpose of attaching the reel flat to a face of the circuit board.

14 Claims, 9 Drawing Sheets

REEL FOR THE PURPOSE OF WINDING A LENGTH OF CABLE OF OPTICAL FIBER CABLE TYPE

The invention relates to the field of reels for winding a segment of cable of optical fiber cable type (sometimes referred to as "coiling reels").

BACKGROUND OF THE INVENTION

At present, Internet operators are massively deploying optical fiber networks, thereby enabling subscribers to benefit from very high data rates.

The manufacturers of residential gateways need to incorporate optical fiber communication interfaces in the residential gateways they supply, which interfaces enable residential gateways to be connected to optical fiber networks.

Conventionally, and as shown in FIGS. 1 and 2, a method of assembling a residential gateway consists in specifying, in having manufactured, and then in receiving, an electric circuit card accompanied by an optical fiber cable 2, which optical fiber cable 2 has a first end fitted with a connector 3 for passing through a partition and a second end with a circular connector 4.

The cable 2 is generally held wound on one face of the circuit card 1 by three studs 5 snap-fastened to the face of the circuit card 1.

After the circuit card 1 and the cable 2 have been delivered, electrical components are positioned on the circuit card 1. The electrical components are then soldered, generally using a wave soldering technique. The circular connector 4 of the cable 2 is connected to one of the electrical components (e.g. a triplexer).

Thereafter, the optical fiber communication interface of the circuit card 1 is tested using the through connector 3. The circuit card 1 with the cable 2 is then integrated in a housing, possibly together with other circuit cards, so as to form the residential gateway.

The above-described assembly method presents several drawbacks.

When pulling on the cable 2 in order to fasten it to the circuit card 1, the diameter of the winding formed by the wound cable is reduced so that it takes on a triangular shape, which runs the risk of damaging the cable 2 and tends to reduce the performance of communication by optical fiber. Furthermore, while soldering the electrical components, the cable 2 must not remain on the circuit card 1, so it is subjected to handling that tends to degrade it.

OBJECT OF THE INVENTION

An object of the invention is to assemble electrical equipment having an optical fiber communication interface (equipment such as the above-described residential gateway), without encountering the above-mentioned drawbacks.

SUMMARY OF THE INVENTION

In order to achieve this object, there is provided a reel for winding a cable segment of optical fiber cable type, the reel comprising:
a winding support for supporting the cable segment;
holder means adapted to hold the cable segment wound around the winding support;
first fastener means for fastening the reel to an edge of an electrical circuit card so that the reel is positioned on one side of the circuit card; and
second fastener means for fastening the reel flat against a face of the circuit card.

By winding the cable segment around the winding support and by fastening the reel on the circuit card using the first fastener means and the second fastener means, the cable segment is positioned on the circuit card while ensuring that the diameter of the winding formed by the wound cable is not reduced when pulling on the cable. By fixing the reel on the circuit card using the second fastener means, the reel is positioned on one side of the circuit card, thus making it possible to perform the wave soldering operation while keeping the reel fastened to the circuit card.

There is also provided a system comprising an electric circuit card and a reel as described above.

There is also provided an assembly method for assembling electrical equipment, the method comprising the following steps:
fastening a reel as described above to an edge of the circuit card by first fastener means of the reel, a cable of optical fiber cable type being wound around the reel;
wrapping the reel in a thermal protection device;
soldering electrical components to the circuit card;
fastening the reel on the face of the circuit card by the second fastener means of the reel;
incorporating the circuit card inside a housing of the electrical equipment.

The invention can be better understood in the light of the following description of a particular non-limiting embodiment of the invention.

BRIEF DESCRIPTION OF THE DRAWINGS

Reference is made to the accompanying drawings, in which.

DETAILED DESCRIPTION OF TEE INVENTION

Figure 1:
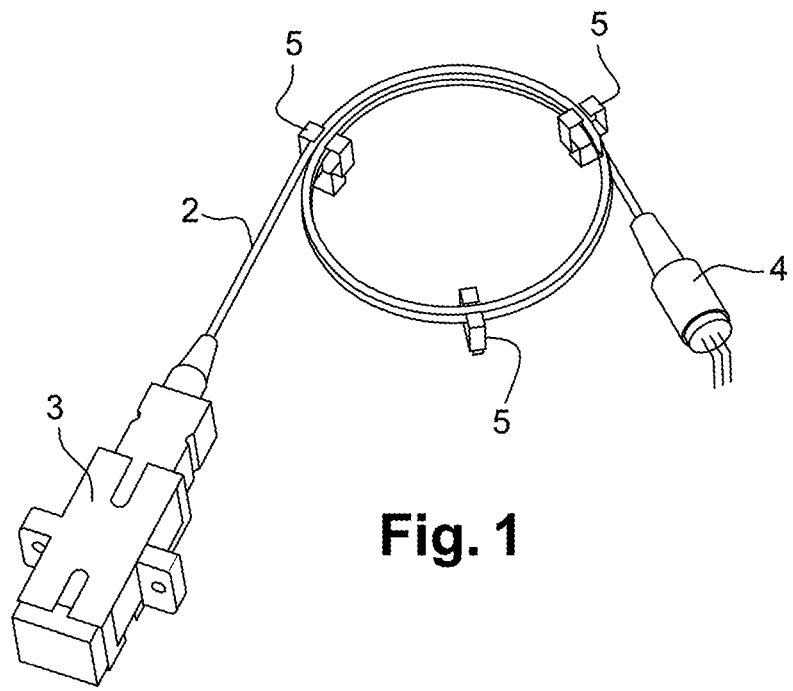
FIG. 1 is a perspective view of an optical fiber cable and of studs enabling the cable to be fastened to an electrical circuit card in the prior art.
Figure 2:
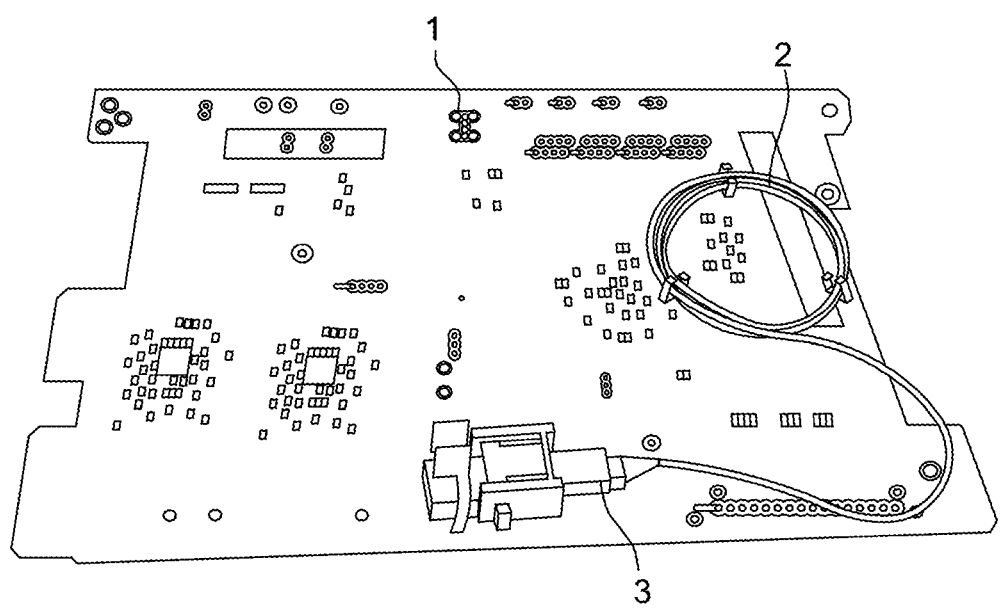
FIG. 2 shows the circuit card and the optical fiber cable fastened to the circuit card in the prior art.
Figure 3:
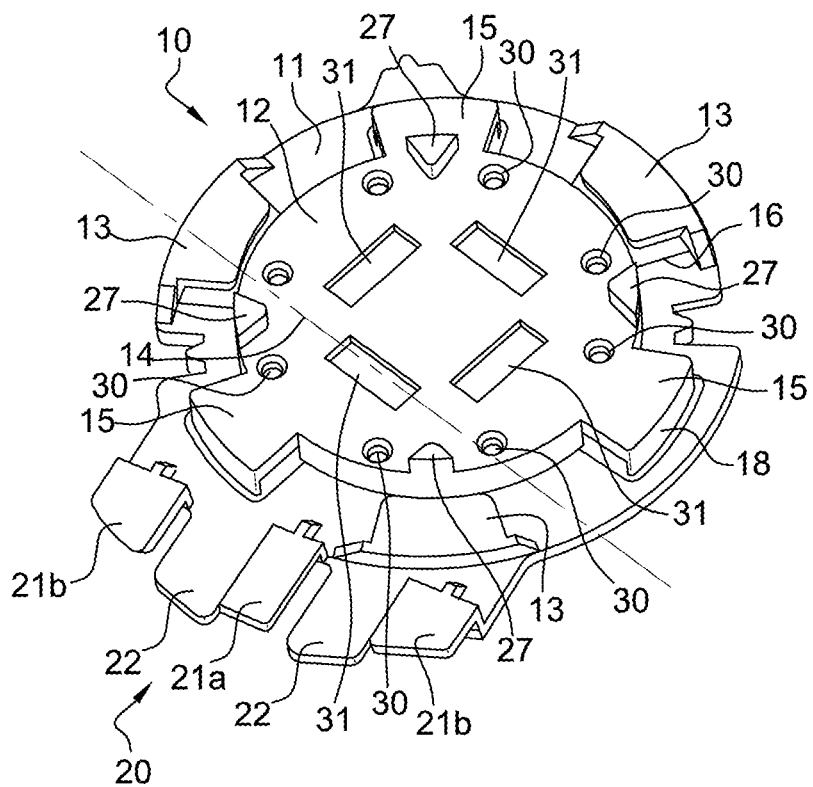
FIG. 3 is a plan view in perspective of the reel of the invention.
Figure 4:
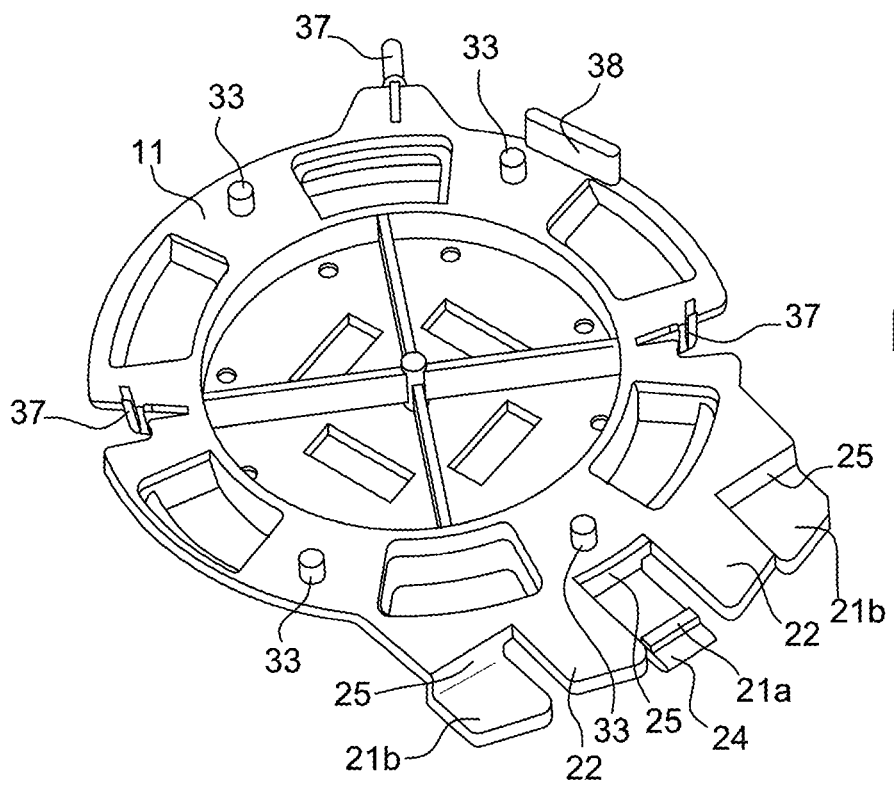
FIG. 4 is a view from beneath in perspective of the reel of the invention.

With reference to FIGS. 3 and 4, the reel 10 of the invention is for having a segment of optical fiber type cable wound thereon and for mounting on an electrical circuit card. The circuit card is itself for integrating in an electrical equipment housing, specifically a housing of a residential gateway.

The reel 10 is of generally flat shape, having a flank 11 of generally circular shape and presenting a top face and a bottom face.

The top face of the reel 10, as shown in FIG. 3, includes a winding support 12 for the segment of cable. In this example, the winding support 12 is generally cylindrical in shape. The winding support 12 is positioned at the center of the flank 11 and of the reel 10.

The top face of the reel 10 has holder means arranged to hold the cable segment wound around the winding support 12.

The holder means comprise three first tongues 13 that extend from a periphery of the reel 10 towards a top face 14 of the winding support 12, and three second tongues 15 that extend from the top face 14 of the winding support 12 towards the periphery of the reel 10.

The first tongues 13, the second tongues 15, the periphery of the reel 10, and a periphery of the winding support 12 thus define a channel 16 in which the segment of cable extends.

It should be observed that the position of each first tongue 13 is diametrically opposite the position of a second tongue 15 across the winding support 12.

It should also be observed that each second tongue 15 has a hook-forming projection 18 at its free end.

Each first tongue 13 thus defines an axial inlet for the segment of cable, while each second tongue 15 defines a radial inlet for the segment of cable. The diametrically opposite positions of the first tongue 13 and of the second tongue 15 serve to prevent the segment of cable becoming unwound accidentally.

The reel 10 also has first fastener means for fastening the reel 10 to an edge of the circuit card so that the reel 10 is positioned on one side of the circuit card. The first fastener means comprise snap-fastener means 20 for co-operating with complementary snap-fastener means of the circuit card and arranged in the proximity of an edge of the circuit card.

The snap-fastener means 20 of the reel 10 comprise five tongues that extend from the periphery of the flank 11 outwards from the reel 10, parallel to the flank 11. The five tongues comprise three top tongues 21 and three bottom tongues 22. When the reel 10 is fastened to the edge of the circuit card by the first fastener means, the circuit card extends between the three top tongues 21 and the two bottom tongues 22.

The three top tongues 21 include a central top tongue 21*a* having hook-forming extra thickness 24 at its free end (visible in FIG. 4), and two outer top tongues 21*b* each having a chamfer at its free end. The central top tongue 21*a* is deformable, while the outer top tongues 21*b* are rigid.

Both bottom tongues 22 are deformable, and each of them has a chamfer at its free end. The two bottom tongues 22 are guide tongues.

Thus, when the reel 10 is positioned on one side of the circuit card so as to be fastened on the edge of the circuit card, the central top tongue 21*a* and the two bottom tongues 22 splay apart a little in order to guide the reel 10, and then the hook 24 of the central top tongue 21*a* becomes positioned in a slot in the complementary snap-fastener means of the circuit card.

It should be observed that each top tongue 21 has a face 25 perpendicular to the flank 11 (visible in FIG. 4) that forms an abutment against the thickness of the circuit card.

The top face of the reel 10 also has four first pegs 27 of triangular section located on the top face 14 of the winding support 12. The four first pegs 27 are positioned at the periphery of the winding support 12 and they are regularly spaced apart.

The four first peg 27 form top abutments for ensuring some minimum distance between the top face of the reel 10 and the housing in which the circuit card is incorporated.

The top face of the reel 10 also has first docking means suitable for receiving a through connector of the type for passing through a partition. The first docking means are positioned on the top face 14 of the winding support 12. The first docking means comprise four arrangements each comprising two circular holes 30 situated at the periphery of the top face 14 of the winding support 12 and a rectangular cavity 31 situated in a central zone of the top face 14 of the winding support 12. The four arrangements thus define four docking positions that are regularly spaced apart on the top face 14 of the winding support 12.

The bottom face of the reel, visible in FIG. 4, has four second pegs 33 of circular section arranged at the periphery of the bottom face of the reel 10.

The four second pegs 33 form bottom abutments for ensuring some minimum height between the bottom face of the reel 10 and a face of the circuit card when the reel 10 is fastened on the face of the circuit card. This minimum height makes it possible in particular to position electrical components on the circuit card and under the reel.

The bottom face of the reel 10 also has second fastener means for fastening the reel 10 flat against a face of the circuit card. The second fastener means comprise three snap-fastener pegs 37 and a positioning rib 38 that are positioned on the periphery of the bottom face of the reel 10.

Figure 5:
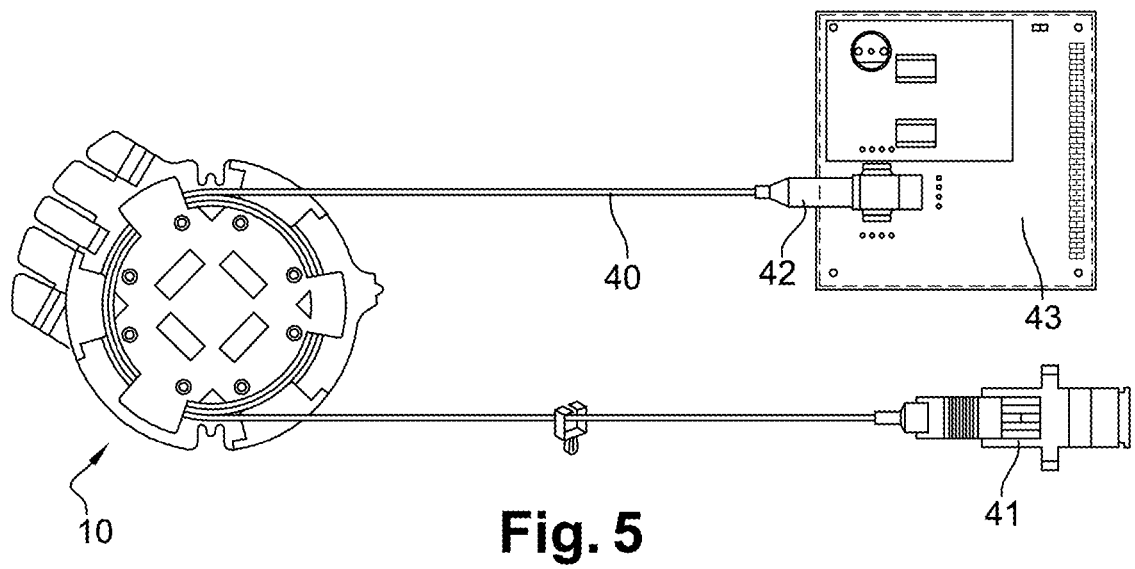
FIG. 5 shows the reel of the invention and the optical fiber cable having a through connector at a first end for passing through a partition and a circular connector at a second end that is connected to a triplexer type component.

With reference to FIG. 5, the segment of cable 40 in this example has, at a first end, a through connector 41 for passing through a partition, and, at a second end, a circular connector 42 that is to be connected to a triplexer type component 43 on the circuit card.

There follows a description of an assembly method of the invention for assembling a residential gateway, said assembly method using the reel 10.

Figure 6:
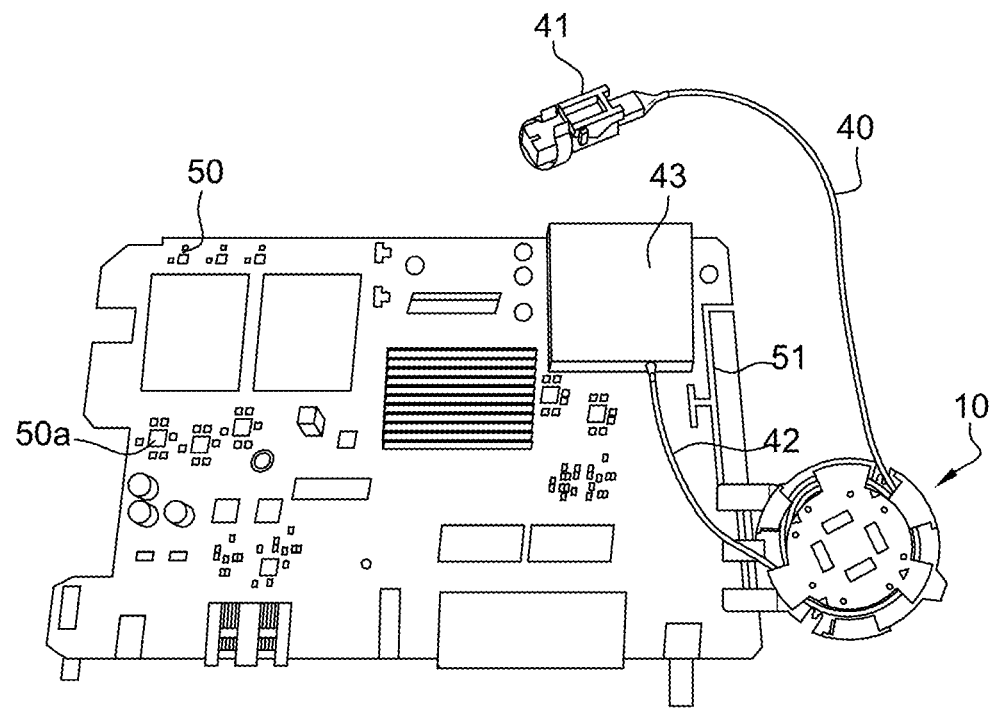
FIG. 6 shows a top face of a circuit card having a reel of the invention fastened thereon using first reel fastener means.

With reference to FIG. 6, the circuit card 50 is manufactured and then delivered together with the reel 10 having the cable segment 40 wound thereon. The reel 10 is fastened on the circuit card 50 at an edge of the circuit card 50 by using the first fastener means for the reel 10, i.e. by using the snap-fastener means of the reel 10 and the complementary snap-fastener means of the circuit card 50. The through connector 41 is initially not mounted on the circuit card or on the reel.

Thereafter, electrical components, and in particular a triplexer 43, are positioned on a top face 50*a* of the circuit card 50. The circular connector 42 of the cable segment is connected to the triplexer 43.

Figure 7:
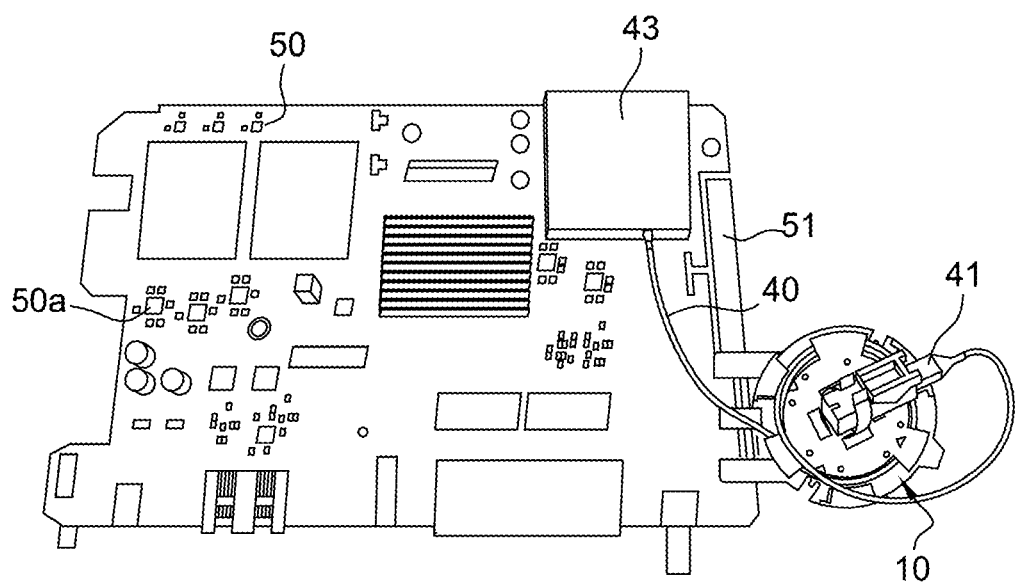
FIGS. 7 and 8 are views analogous to FIG. 6, a through connector being mounted on first docking means of the reel.
Figure 8:
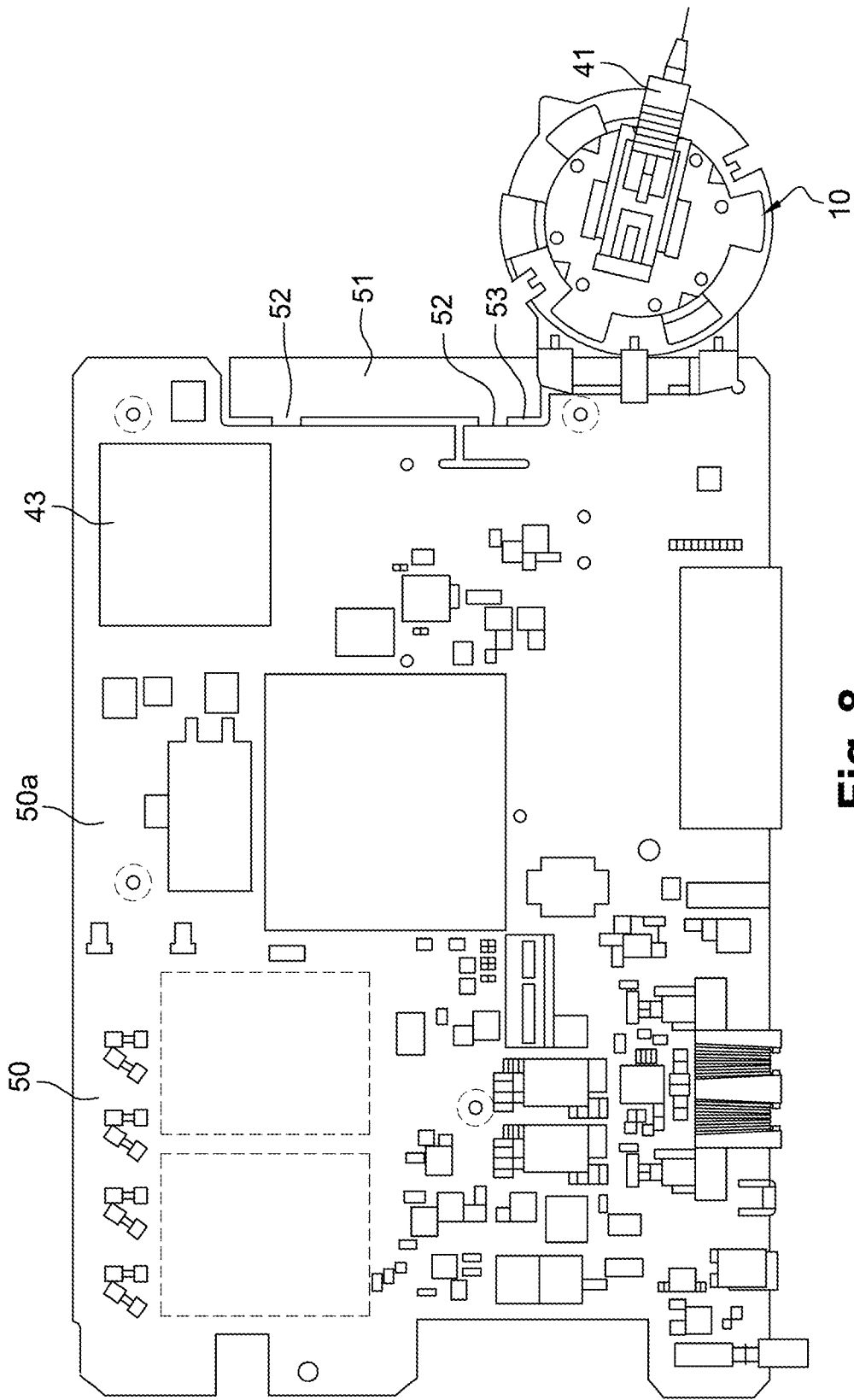

With reference to FIGS. 7 and 8, the through connector 41 is then positioned on the first docking means of the reel 10. The reel 10 the cable segment 40, and the through connector 41 are wrapped in a thermal protection device, specifically a protective pouch (not shown in the figures) made of fireproof and heatproof material.

The electrical components are then soldered on the top face 50*a* of the circuit card 50 by wave soldering.

The protective pouch is then removed and the reel 10 is detached from the edge of the circuit card 50. The circular connector 42 of the cable segment 40 remains connected to the triplexer 43.

Figure 9:
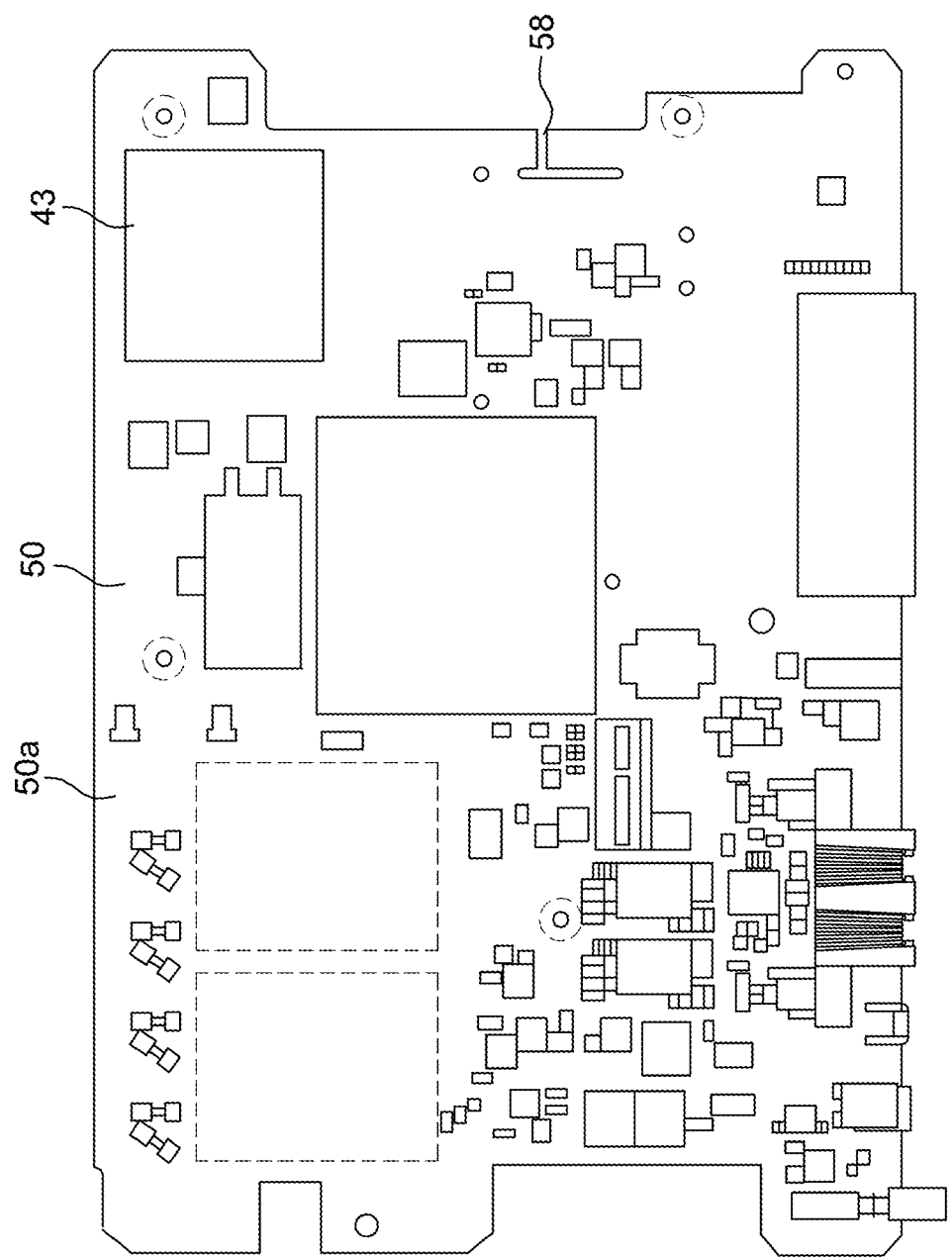
FIG. 9 shows a top face of the circuit card.

As can be seen clearly in FIGS. 8 and 9, it should be observed that the edge of the circuit card 50 to which the reel 10 is fastened constitutes a detachable printed circuit portion 51. The detachable printed circuit portion 51 is connected to the remainder of the printed circuit of the circuit card 50 by narrow printed circuit portions 52 that enable the detachable printed circuit portion 51 to be detached. FIG. 9 shows the circuit card 50 once the detachable printed circuit portion 51 has been detached.

It should also be observed that when the detachable printed circuit portion 51 is present on the circuit card 50, the gap 53 between the detachable printed circuit portion 51 and the remainder of the printed circuit of the circuit card 50 defines the slot of the complementary snap-fastener means of the circuit card 50. The extra thickness 24 (visible in FIG. 4) forming the hook of the central top tongue 21a of the reel 10 is inserted in said slot when the reel 10 is mounted on the circuit card 50 via the first fastener means.

Figure 10:
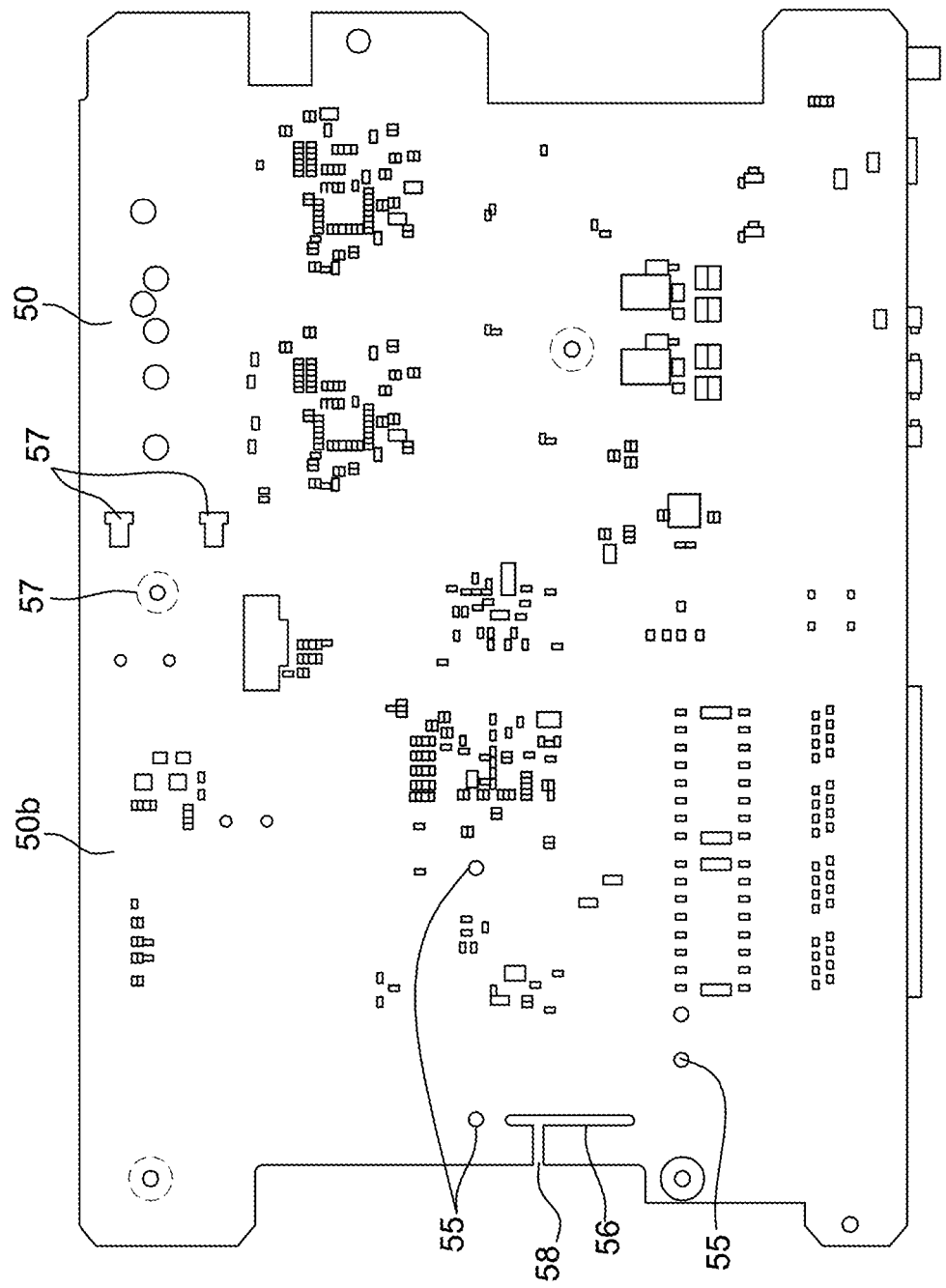
FIG. 10 shows a bottom face of the circuit card.
Figure 11:
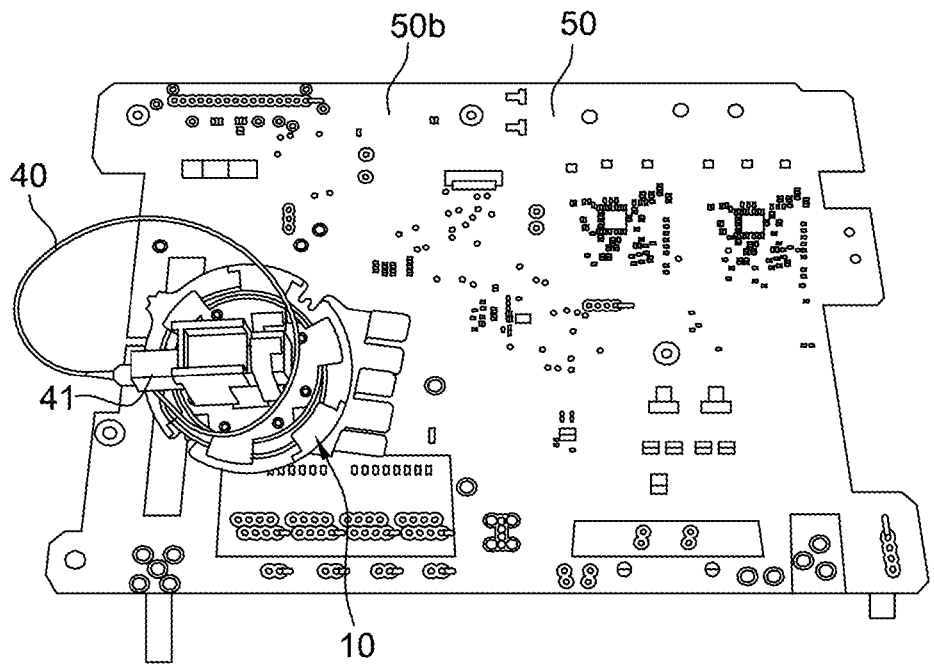
FIG. 11 show a bottom face of the circuit card, the reel of the invention being fastened by means of second reel fastener means.

With reference to FIGS. 10 and 11, the circuit card 50 is then turned over and the reel 10 is fastened flat against the bottom face 50b of the circuit card 50 by the second fastener means of the reel 10. Specifically, the three snap-fastener pegs 37 of the second fastener means are inserted in three snap-fastener orifices 55 in the circuit card, and the positioning rib is inserted in a positioning slot 56 in the circuit card 50. The through connector 41 is still mounted on the reel 10.

Figure 12:
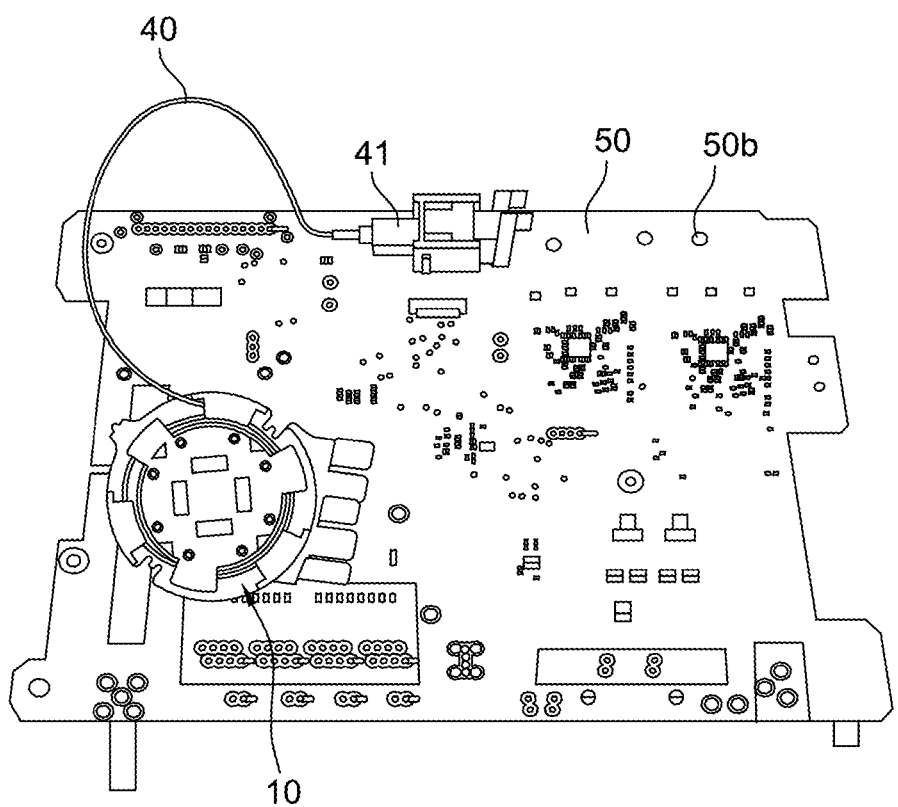
FIGS. 12 and 13 are views analogous to FIG. 11, the through connector being mounted on second docking means of the circuit card.
Figure 13:
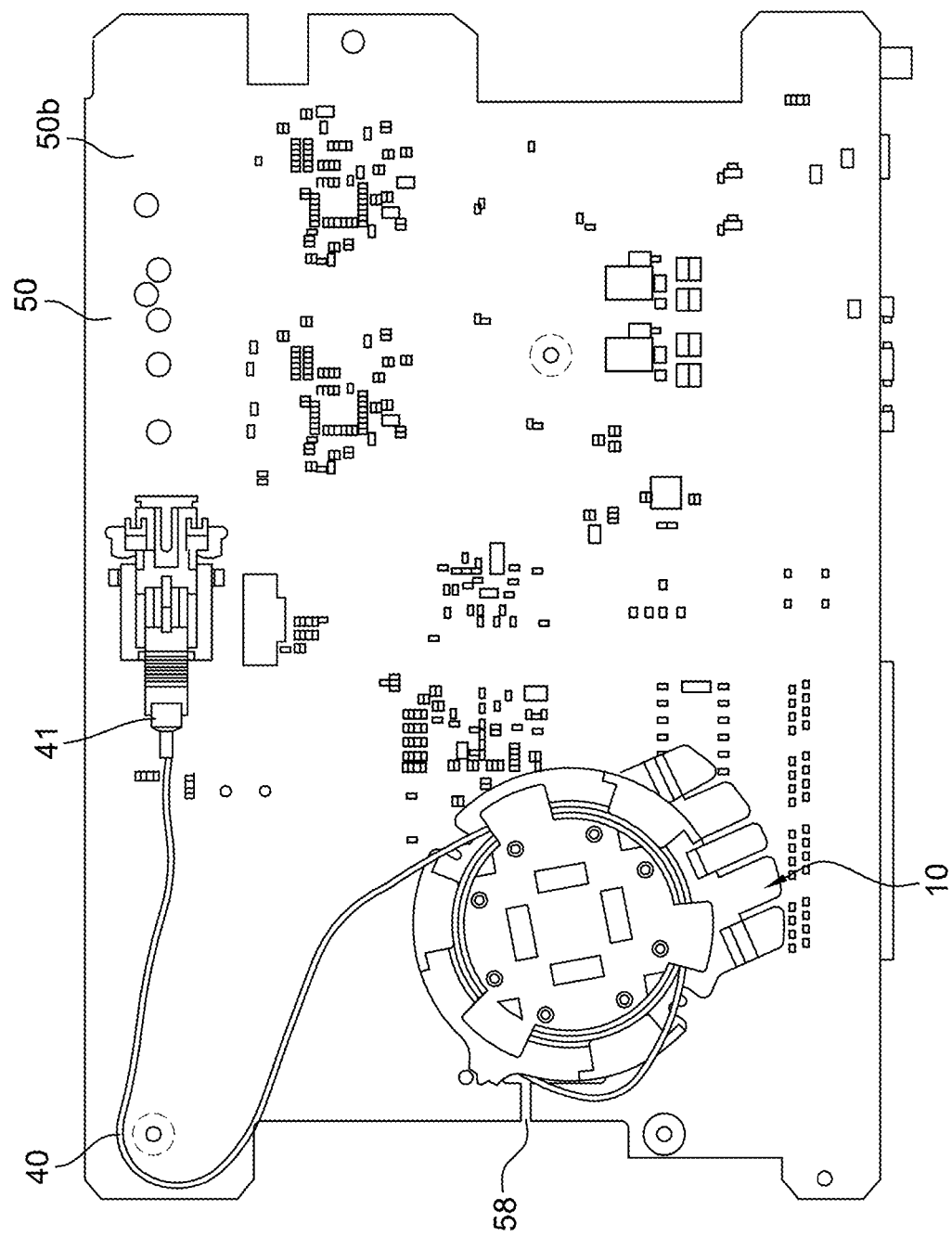

Thereafter, and with reference to FIGS. 12 and 13, the through connector 41 is positioned on the second docking means 57 of the circuit card 50.

The cable segment 40 is then connected via the circular connector 42 to the triplexer 43 mounted on the top face 50a of the circuit card 50, while the through connector 41 is positioned on the bottom face 50b of the circuit card. The cable segment 40 travels between the top face 50a of the circuit card 50 and the bottom face 50b of the circuit card 50 via a cable-passing slot 58 that extends in continuity with the positioning slot 56 and perpendicularly thereto.

A cable grommet (not shown in the figures) is fastened on the bottom face of the circuit card 50.

The circuit card 50 and the cable segment 40 are then ready to be tested, in particular by using the through connector 41, and then to be incorporated in a housing of the residential gateway.

Naturally, the invention is not limited to the embodiment described, but covers any variant coming within the ambit of the invention as defined by the claims.

It is stated herein that the circuit card is incorporated in a residential gateway, however the invention applies to any type of electrical equipment, and naturally to any type of cable.

The numbers of first tongues, of second tongues, of top tongues, of bottom tongues, of circular holes, of rectangular cavities, of first pegs, of second pegs, of snap-fastener pegs, of positioning ribs, of snap-fastener orifices, etc., may naturally differ from the numbers in the embodiment described.

The invention claimed is:

1. A reel for winding a cable segment of optical fiber cable type, the reel comprising:
    a winding support for supporting the cable segment;
    holder means adapted to hold the cable segment wound around the winding support;
    first fastener means for fastening the reel to an edge of an electrical circuit card so that the reel is positioned on one side of the circuit card;
    second fastener means for fastening the reel flat against a face of the circuit card.

2. The reel according to claim 1, wherein the first fastener means comprise snap-fastener means for co-operating with complementary snap-fastener means of the circuit card arranged in the proximity of an edge of the circuit card.

3. The reel according to claim 1, wherein the holder means comprise at least one first tongue that extends from one periphery of the reel towards the winding support and a second tongue that extends from the winding support towards the periphery of the reel, the first tongue, the second tongue, the periphery of the reel, and the periphery of the winding support together defining a channel in which the cable segment extends.

4. The reel according to claim 3, wherein the first tongue thus defines an axial inlet for the cable segment, while the second tongue defines a radial inlet for the cable segment.

5. The reel according to claim 1, wherein the top face of the reel has a top abutment for ensuring some minimum distance between the top face of the reel and a housing in which the circuit card is incorporated.

6. The reel according to claim 1, wherein a bottom face of the reel has a bottom abutment for ensuring some minimum height between the bottom face of the reel and the face of the circuit card when the reel is fastened on the face of the circuit card.

7. The reel according to claim 1, including first docking means suitable for receiving a through connector of the type for passing through a partition.

8. The reel according to claim 1, including a positioning rib for inserting in a corresponding positioning slot formed in the circuit card for positioning the reel correctly.

9. A system comprising an electric circuit card and a reel according to claim 1.

10. The system according to claim 9, wherein the first fastener means comprise snap-fastener means for co-operating with complementary snap-fastener means of the circuit card arranged in the proximity of an edge of the circuit card, the complementary snap-fastener means of the circuit card including a gap between a detachable portion of the circuit card and the remainder of the circuit card.

11. The system according to claim 9, wherein the circuit card includes second docking means suitable for receiving a through connector of the type for passing through a partition.

12. An assembly method for assembling electrical equipment, the method comprising the following steps:
    fastening a reel according to claim 1 to an edge of the circuit card by first fastener means of the reel, a cable of optical fiber cable type being wound around the reel;
    wrapping the reel in a thermal protection device;
    soldering electrical components to the circuit card;
    fastening the reel on the face of the circuit card by the second fastener means of the reel;
    incorporating the circuit card inside a housing of the electrical equipment.

13. The assembly method according to claim 12, wherein the electrical components are soldered by wave soldering.

14. The assembly method according to claim 12, further comprising the following steps:
    prior to soldering the electrical components, connecting to one end of the cable a through connector of the type for passing through a partition, and positioning the through connector on the first docking means of the reel provided for this purpose;

after soldering the components, positioning the through connector on second docking means of the circuit card provided for this purpose.

\* \* \* \* \*